(12) United States Patent
Hu

(10) Patent No.: US 6,576,541 B2
(45) Date of Patent: Jun. 10, 2003

(54) METHOD AND STRUCTURE FOR PRODUCING BUMPS ON AN IC PACKAGE SUBSTRATE

(75) Inventor: Chu-Chin Hu, Hsinchu (TW)

(73) Assignee: Phoenix Precision Technology Corporation (TW)

( * ) Notice: Subject to any disclaimer, the term of this patent is extended or adjusted under 35 U.S.C. 154(b) by 0 days.

(21) Appl. No.: 09/796,268

(22) Filed: Feb. 28, 2001

(65) Prior Publication Data

US 2002/0060160 A1 May 23, 2002

(30) Foreign Application Priority Data

Aug. 29, 2000 (TW) .......................... 89117431 A

(51) Int. Cl.⁷ .............................................. H01L 21/44
(52) U.S. Cl. ..................... 438/614; 438/612; 438/613
(58) Field of Search ............................. 257/734, 735, 257/736–738, 748, 733, 777–778, 779; 438/612, 613, 614, 108, 118

(56) References Cited

U.S. PATENT DOCUMENTS 5,506,023 A * 4/1996 Ohmori et al.
5,757,072 A * 5/1998 Gorowitz et al.
5,937,320 A * 8/1999 Andricacos et al.
6,297,140 B1 * 10/2001 Uzoh et al.
6,423,625 B1 * 7/2002 Jang et al. .................. 438/614

* cited by examiner

Primary Examiner—Wael Fahmy
Assistant Examiner—Dilinh Nguyen

(57) ABSTRACT

A method for producing bumps on an IC package substrate. The method first deposits a medium layer on a protective layer of the IC package substrate, which has good adherence ability to both the copper layer and the protective layer. Then, a CVD process is applied to deposit a copper layer on the medium layer to form the metal layer. A dry film is thereafter formed on the metal layer and several contact windows are opened therein. A metal pad and a bump are electroplated in the contact windows. Then the dry film is removed, the bumps are protruded out of the substrate with a predetermined height to be solder bumps with an IC chip. Thus, an IC chip no longer needs to form bumps thereon anymore and to save cost and reduce pitch between bumps down to 150 um. Therefore, the improved BGA substrate may be applied on to smaller IC package device to meet the trend for minimizing package sizes.

13 Claims, 4 Drawing Sheets

METHOD AND STRUCTURE FOR PRODUCING BUMPS ON AN IC PACKAGE SUBSTRATE

FIELD OF THE INVENTION

This invention relates to a novel method and structure for producing bumps for IC package substrate, and more particularly to a Flip-Chip BGA substrate with solder bumps form thereon.

DESCRIPTION OF THE PRIOR ART

Nowadays, many companies are trying very hard to approach smaller and more effective IC chips technology of Integrated Circuit Chip. In addition to the improvements of IC chips, the IC Package Technology also has great achievement. From Lead Frame Package to BGA Package and to Tape Automatic Bonding BGA, TAB BGA, kinds of IC Package technologies are invented for IC chips, which are smaller and smaller again. To adapt for advance technology, mini BGA and Chip Scale Package (CSP) are created for the scale of substrate/chip value less than 1.2. And to do so, most of them apply Flip-Chip technology to package these chips with package substrates.

Please refer to FIG. 1; a prior Flip-Chip technology is present in it. The prior Flip-Chip technology first applies a BGA substrate 11 and forms a circuit layer 12 and a protective layer 13 thereon. Several contact windows are opened to expose some portions of the circuit layer 12. A solder pad 14, which is preferably made up by copper, tin and lead materials, is electroplated on the exposed circuit layer 12 in the contact window and a bump 15 is thereafter formed on.

On active side of the IC chip 21, an Aluminum alloy layer 22 and a protective layer 23 are formed thereon. A solder bump 24 (or gold bump) is also formed on the IC chip 21, which is contacted with the Aluminum alloy layer 22. During package, the IC chip 21 is heated and pressed onto the BGA substrate 11 to merge the solder bump 24 and the bump 15, by which not only electrically connects the IC chip 21 and the BGA substrate 11 and also binds themselves into one complement.

However, such a structure has some disadvantages as described hereunder.

1, the pitch between the bumps, which are made by screen print technology, are mostly around 200~250 μm. By screen print technology or attaching BGA bumps onto the substrate, which are not very critical techniques, it is very difficult to make pitches less than 150 μm.

2, the cost is higher to make bumps 24 on the IC chips 21. The facilities for producing IC are very expensive. In addition, the integrated circuits, which are composed by light doped silicon, silicide and metal Aluminum, are very complicated and lower heat-resistant. The bumps on the IC chip are no doubt made under critical conditions by costly facilities. Thus, the cost is higher and the yield is lower. On the other side, circuits on the BGA substrate are made by copper, which can endure higher heat, and are much easier to make than those on IC chip. So, if bumps were made on the BGA substrate, those disadvantages can be overcome.

SUMMARY OF THE INVENTION

The object of present invention is to form bumps on the Flip-Chip BGA substrates. This object no longer forms the bumps formed on IC chips but BGA substrates. The bumps on the BGA substrates can still work for IC chips soldering therefore to reduce cost.

The other object of present invention is to replace bump screen print technique by metal electroplating to scale down the distance between bumps, even less than 150 μm. So the feature size of the package device could be further minified.

Therefore, the embodiment of present invention for producing bumps on BGA substrate comprises the steps of:

A) Applying a substrate, on which a circuit layer in formed thereon. A protective layer is formed on the circuit layer and there are several contact windows opened therein to expose the circuit layer.

A1) Depositing a medium layer on the protective layer, which is also opened at the contact windows.

B) Electroless metalizing a metal layer on the surface of the substrate, which covering the surface of the medium layer, the inside surface of the contact window, and the surface of the exposed circuit layer.

C) Forming a dry film on the metal layer, which is opened at the contact windows to expose the metal layer.

D) Forming metal pads with a predetermined thickness on the exposed metal layer.

E) Forming bumps on the metal pads.

F) Removing the dry film and the metal layer thereon which protrudes the bumps out.

G) Reflowing and flatting the bumps to generalize them into standard scale.

In this invention, protruded bumps are formed on the BGA substrate for soldering with an IC chip. Therefore, the IC chip no longer needs to make bumps thereon. And the electroplating technique is used as a replacement of the screen print technique to scale the distance between bumps down to 150 μm and around 80~120 μm. Therefore, the improved BGA may be applied on to smaller IC chips to catch up the trend.

The structure of this invention comprises a substrate, a circuit layer made on the substrate, a protective layer on the circuit layer with contact windows therein, a metal layer on the circuit layer, metal pads on the metal layer, and bumps on the metal pads for soldering with an IC chip.

However, some solder balls are also formed on the other side of the substrate for connecting with a motherboard. For connecting with a motherboard, the pitches of these solder balls are more than 200 μm, which have different purposes and producing method with present invention.

BRIEF DESCRIPTION OF THE DRAWINGS

These and other features and advantages of the present invention will become more apparent from the following detailed description of exemplary embodiments thereof as illustrated in the accompanying drawings, in which.

DETAILED DESCRIPTION OF THE PREFERRED EMBODIMENT

Figure 1:
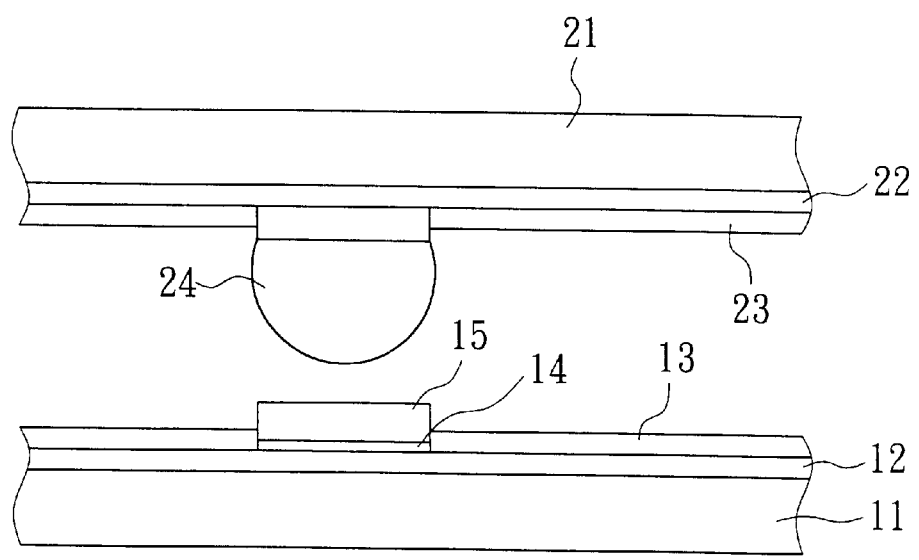
FIG. 1 is a perspective view of the prior Flip-Chip technology.

Present invention is to form bumps on the Flip-Chip BGA substrates. The bumps are no longer formed on IC chips but BGA substrates. A medium layer is firstly made on a protective layer outside of the substrate. The medium layer is made up by a material, which has good adherence ability to copper ions and the protective layer to overcome the issue that copper ions doesn't easily attach on the protective layer. Thereafter, a metal layer (copper layer) is deposited on the substrate. A dry film is formed thereon and contact windows are opened. In the contact windows, a copper layer and bumps which made by Stannum/lead alloy are formed in sequence. After removing the dry film, the bumps are protruded out of the substrate with a predetermined height to be solder bumps with an IC chip.

Please refer to FIGS. 2A~2H, the steps of the embodiment.

Step 1: Please refer to FIG. 2A. A BGA substrate 31, on which a circuit layer 32 (with copper or gold material) and a protective layer 33 on the circuit layer 32 are formed thereon, is firstly applied. A contact window 34 is opened in the protective layer 33 to expose some parts of the circuit layer 32.

And on the other side of the BGA substrate 31, a second circuit layer 52 is formed thereon. A conductive through hole 55 is made to connect the circuit layer 32 and the second circuit layer 52. A second protective layer 53 and a second contact window 54 are also formed. A solder ball 56 is formed in the second contact window 54, which is applied to merge with motherboard or circuit board (not shown in FIG. 2A). Because said conductive through hole 55, and the circuit layer 52 on the lower surface of the substrate, the second protective layer 53, the second contact window 54, and the solder bump 56 are well-known and not the feature of the present invention, so they aren't go into details.

Figure 2A:
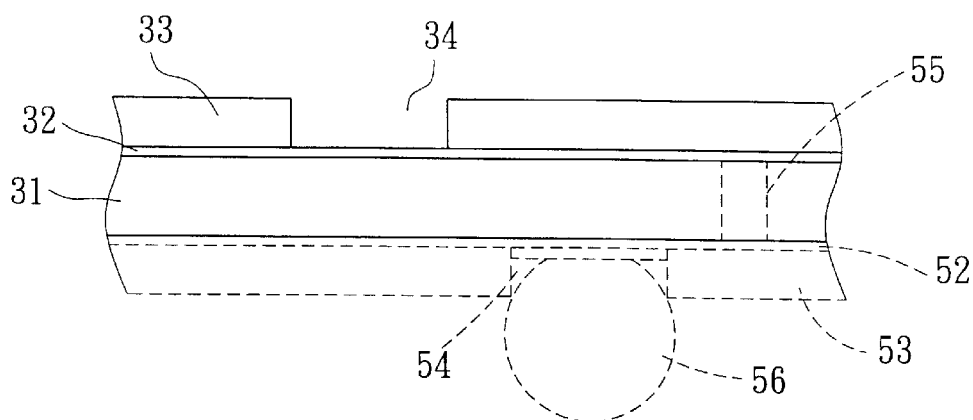
FIGS. 2A~2H is the steps of a method of the present invention to make bumps on BGA substrate and structure thereof.
Figure 2B:
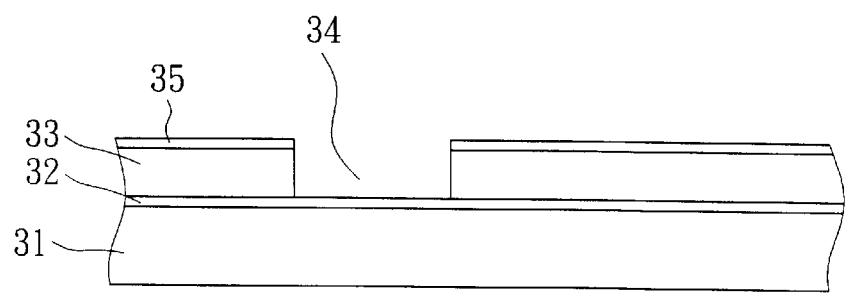

Step 2: please refer to FIG. 2B. A medium layer 35 is made on the protective layer 33 and also opened at the contact window 34. The medium layer 35 is deposited to resolve an issue that metal ions, such as copper, may not able to attach on the protective layer 33. So, the materials of the medium layer 35 have good adherence ability for the metal ions and the protective layer 33. The materials may be chromium, titanium and oxidized copper. This medium layer 35 may be formed by chemical vapor deposition (CVD) method, sputtering, printing, spin coating (only for liquid resin) or pasting a thin metal thin film and defined by photo resister, photography, etching to open the medium layer 35 for exposing the circuit layer 32.

Figure 2C:
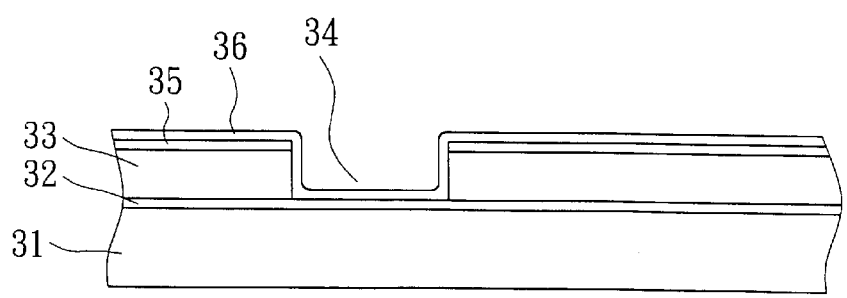

Step 3: please refer to FIG. 2C. A metal layer 36 is formed on the surface of the BGA substrate 31 by electroless metalizing, which covering the surface of the medium layer 35, the inside surface of the contact window 34, and the surface of the exposed circuit layer 32. The material of the metal layer 36 may be chromium, titanium, copper, gold, iron, or nickel. The metal layer 36 is deposited by sputtering or chemical deposition, which used in plating through hole (PTH) technology. The metal layer 36 works as a conducting circuit at the following electroplating process, and is removed after said electroplating process, so it's no need to have a thick thickness. And the peel strength does not need to be high, either. Of course, a thicker metal layer may be form on the metal layer 36 if required.

Figure 2D:
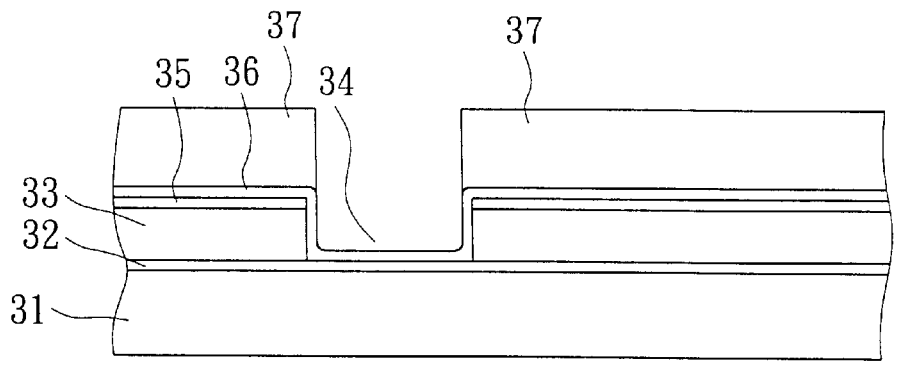

Step 4: please refer to FIG. 2D. A dry film 37 with an opening at the contact window 34 is formed on the metal layer 36 to expose the metal layer 36. The material of the dry film 37 may be polymer, photo-resister, and made by spin coating, printing or pasting. In the embodiment, the dry film 37 is made by photo-resister, which is defined by a photo mask to translate patterns thereon.

Figure 2E:
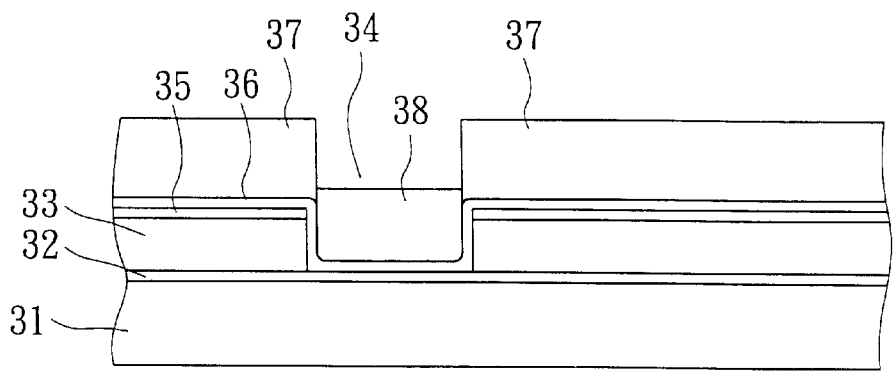

Step 5: please refer to FIG. 2E. A metal pad 38 is electroplated on the metal layer 36. The material of the metal pad 38 may be chromium, titanium, copper, gold, iron, nickel, or alloy thereof. Generally, the thickness of the metal pad 38 is preferable a little bigger or equal to the protective layer 33.

Figure 2F:
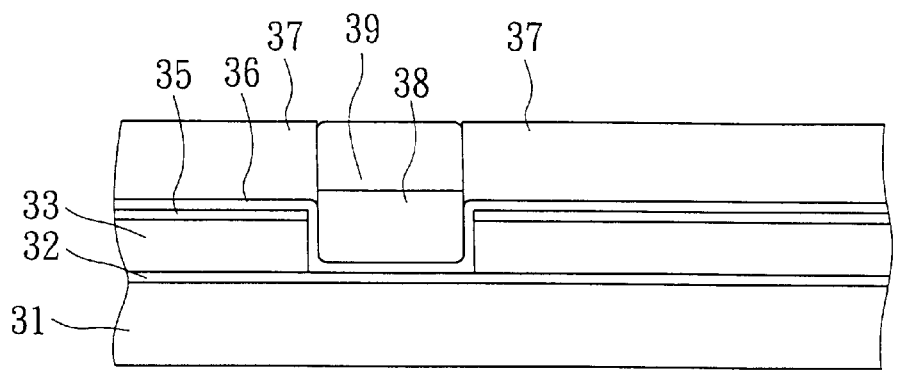

Step 6: please refer to FIG. 2F. A bump 39 is formed on the metal pad 38 by continuous electroplating. The material of the bump 39 may be copper, tin, lead or alloy thereof. In the embodiment, the thickness and the position of the metal pad 38 and bump 39 are defined by the dry film 37. However, two dry films may be applied to define the metal pad 38 and bump 39 in two steps independently in another preferred embodiment.

Figure 2G:
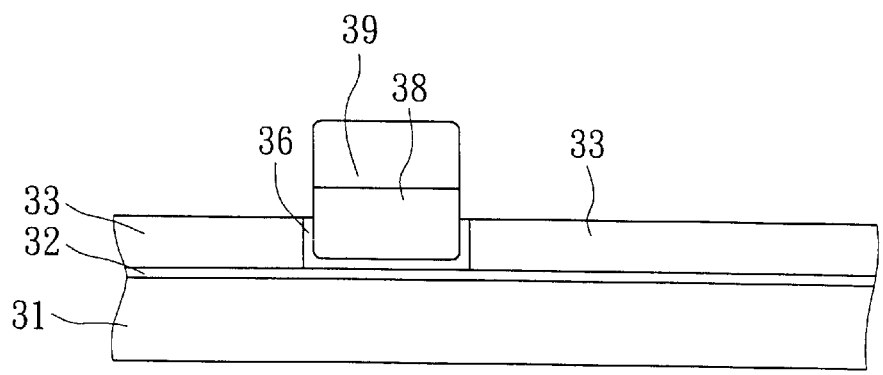
Figure 2H:
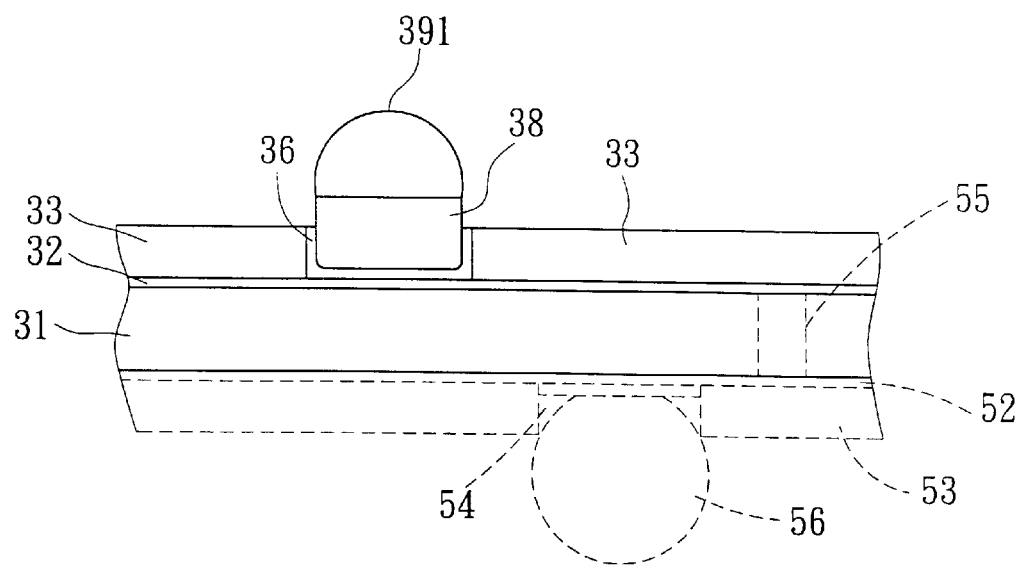

Step 7: please refer to FIG. 2G. The dry film 37, the medium layer 35 and the metal layer 36 on the protective layer 33 are removed away. In the embodiment, selective dry etching technology is applied to remove them. However, if the medium layer 35 is pasted on the protective layer 33, all of them (the dry film 37, the medium layer 35 and the metal layer 36) can be peeled away easily. As described, the dry film 37, the medium layer 36 and the metal layer 35 are removed at last, so they don't need high attaching ability. The metal layer 36 is very thin, so even been peeled directly; the metal pad 38 and bump 39 will not be hurt. (Because the attaching ability of electroplating is better.) Step 8: please refer to FIG. 2H. Reflow and generalize the bumps 39 into bumps 391 to make each of them as high as a pre-determined value. The bumps 391 are higher than the surface of the BGA substrate. So it can directly merge with an IC chip. So, on the IC chip, there is no need to make bumps anymore. In this invention, the bumps 391 are made by electroplating which have higher accurate than prior technology. Therefore the pitch between bump balls may down to 150 $\mu$m and around 80~120 $\mu$m to fit the specification of the heat pressing process.

And on the other side of the BGA substrate 31, a second circuit layer 52 is formed thereon. A conductive through hole 55 is made to connect the circuit layer 32 and the second circuit layer 52. A second protective layer 53 and a second contact window 54 are also formed. A solder bump 56 is formed in the second contact window 54, which is applied to merge with motherboard (not shown in FIG. 2A).

From the above, the invention has the following advantages.

1, The pitch between bumps is smaller than prior art. By electroplating, the bump has pitch between each other downed into 80~120 $\mu$m to fit the specification of the heat pressing process. Therefore smaller IC chips are adapted by this invention.

2, The bump has lower cost than prior art. The bump is made on the BGA substrate by electroplating. Compared to the technology which forming bumps on IC chip, the present invention is under a looser process condition and technical complexity, and have a higher yield and low cost than prior art.

It's understood that the above-described embodiment is merely illustrative of the possible specific embodiment, which may present main principles of the invention. Other arrangements may readily by devised in accordance with these principles by those skilled in art without departing from the scope and spirit of the invention.

What is claimed is:

1. A method for producing bumps on an IC package substrate, comprising the steps of:

providing a substrate on which at least a circuit layer is formed thereon;

forming a protective layer on the substrate and opening a plurality of contact windows therein to expose a portion of the circuit layer;

forming a medium layer on the protective layer and having a plurality of openings thereon to expose the contact windows;

electroless metalizing a metal layer on the surface of the substrate, the metal layer covering the medium layer and the exposed circuit layer;

forming a dry film on the metal layer having a plurality of openings to expose the metal layer located on the contact windows;

forming a plurality of metal pads with a predetermined thickness on the exposed metal layer by electroplating;

forming a plurality of bumps on the metal pads with the bumps having a pitch of less than 150 micrometers;

removing the medium layer, the metal layer and the dry film at the same time to produce protruded bumps.

2. The method of claim 1, wherein said material of the medium layer has good adherence to the protective layer and the metal layer.

3. The method of claim 1, wherein said the medium layer is made by a method selected from a group consisting of CVD, electroplating, spin coating, screen printing, and pasting technologies.

4. The method of claim 1, further including the step of increasing the thickness of the metal layer by electroplating.

5. The method of claim 4, wherein the material of the increased thickness is different from the metal layer.

6. The method of claim 1, wherein said electroless metalizing the metal layer is accomplished by sputtering.

7. The method of claim 1, wherein said electroless metalizing the metal layer is accomplished by chemical deposition.

8. The method of claim 1, wherein said material of the protective layer is selected from the group consisting of resin, polymer and photo-resister.

9. The method of claim 1, wherein said protective layer is made by a method selected from the group consisting of spin coating, screen printing, and pasting technologies.

10. The method Of claim 1, said dry film is formed and defined by the following steps:

D1) forming a dry film on the metal layer;

D2) translating a pattern by a photo mask to the dry film;

D3) defining the dry film by photography technology to expose the metal layer located on the contact windows.

11. The method of claim 1, wherein the material of said metal pad is chosen from the group consisting of copper, gold, nickel, chromium, aluminum, and alloys thereof.

12. The method of claim 1, wherein said material of the bumps is chosen from the group consisting of copper, tin, lead and alloys thereof.

13. The method of claim 1, further including:

reflowing and flattening the bumps to normalize the bumps into a standard scale.

* * * * *